(12) United States Patent
Haba

(10) Patent No.: US 7,999,379 B2
(45) Date of Patent: Aug. 16, 2011

(54) MICROELECTRONIC ASSEMBLIES HAVING COMPLIANCY

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/360,230

(22) Filed: Feb. 23, 2006

(65) Prior Publication Data

US 2006/0194365 A1 Aug. 31, 2006

Related U.S. Application Data

(60) Provisional application No. 60/656,480, filed on Feb. 25, 2005.

(51) Int. Cl.
H01L 23/52 (2006.01)
(52) U.S. Cl. ........................ 257/737; 257/779
(58) Field of Classification Search .................. 257/737
See application file for complete search history.

(56) References Cited

U.S. PATENT DOCUMENTS

| | | |
|---|---|---|
| 4,001,870 A | 1/1977 | Saiki et al. |
| 4,021,838 A | 5/1977 | Warwick et al. |
| 4,190,855 A | 2/1980 | Inoue et al. |
| 4,284,563 A | 8/1981 | Wong |
| 4,300,153 A | 11/1981 | Hayakawa et al. |
| 4,365,264 A | 12/1982 | Mukai et al. |
| 4,381,602 A | 5/1983 | McIver |
| 4,396,936 A | 8/1983 | McIver et al. |
| 4,618,878 A | 10/1986 | Aoyama et al. |
| 4,642,889 A | 2/1987 | Grabbe |
| 4,671,849 A | 6/1987 | Chen et al. |
| 4,716,049 A | 12/1987 | Patraw |
| 4,783,594 A | 11/1988 | Schulte et al. |
| 4,813,129 A | 3/1989 | Karnezos |
| 4,885,126 A | 12/1989 | Polonio |
| 4,902,606 A | 2/1990 | Patraw |
| 4,924,353 A | 5/1990 | Patraw |
| 4,955,132 A | 9/1990 | Ozawa et al. |
| 4,962,985 A | 10/1990 | LeGrange |
| 4,977,441 A | 12/1990 | Ohtani et al. |
| 5,001,542 A | 3/1991 | Tsukagoshi et al. |

(Continued)

FOREIGN PATENT DOCUMENTS

JP 57121255 7/1982

(Continued)

OTHER PUBLICATIONS

International Search Report, PCT/US2006/006554, Dated Jun. 13, 2006.

(Continued)

*Primary Examiner* — Quoc D Hoang
*Assistant Examiner* — Tony Tran
(74) *Attorney, Agent, or Firm* — Lerner, David, Littenberg, Krumholz & Mentlik, LLP

(57) ABSTRACT

A microelectronic assembly includes a microelectronic element, such as a semiconductor wafer or semiconductor chip, having a first surface and contacts accessible at the first surface, and a compliant layer overlying the first surface of the microelectronic element, the compliant layer having openings in substantial alignment with the contacts of the microelectronic element. The assembly desirably includes conductive posts overlying the compliant layer and projecting away from the first surface of the microelectronic element, the conductive posts being electrically interconnected with the contacts of the microelectronic element by elongated, electrically conductive elements extending between the contacts and the conductive posts.

46 Claims, 6 Drawing Sheets

U.S. PATENT DOCUMENTS

| | | | |
|---|---|---|---|
| 5,070,297 A | 12/1991 | Kwon et al. | |
| 5,072,520 A | 12/1991 | Nelson | |
| 5,082,811 A | 1/1992 | Bruno | |
| 5,110,388 A | 5/1992 | Komiyama et al. | |
| 5,140,404 A | 8/1992 | Fogal et al. | |
| 5,148,265 A | 9/1992 | Khandros et al. | |
| 5,148,266 A | 9/1992 | Khandros et al. | |
| 5,180,311 A | 1/1993 | Schreiber et al. | |
| 5,187,020 A | 2/1993 | Kwon et al. | |
| 5,194,930 A | 3/1993 | Papathomas et al. | |
| 5,203,076 A | 4/1993 | Banerji et al. | |
| 5,225,966 A | 7/1993 | Basavanhally et al. | |
| 5,249,101 A | 9/1993 | Frey et al. | |
| 5,265,329 A | 11/1993 | Jones et al. | |
| 5,302,550 A | 4/1994 | Hirota et al. | |
| 5,310,699 A | 5/1994 | Chikawa et al. | |
| 5,316,788 A | 5/1994 | Dibble et al. | |
| 5,349,240 A | 9/1994 | Narita et al. | |
| 5,355,283 A | 10/1994 | Marrs et al. | |
| 5,363,277 A | 11/1994 | Tanaka et al. | |
| 5,371,404 A | 12/1994 | Juskey et al. | |
| 5,393,697 A | 2/1995 | Chang et al. | |
| 5,414,298 A | 5/1995 | Grube et al. | |
| 5,430,329 A | 7/1995 | Harada et al. | |
| 5,431,328 A | 7/1995 | Chang et al. | |
| 5,431,571 A | 7/1995 | Hanrahan et al. | |
| 5,455,390 A | 10/1995 | DiStefano et al. | |
| 5,477,611 A | 12/1995 | Sweis et al. | |
| 5,483,106 A | 1/1996 | Echigo et al. | |
| 5,489,749 A | 2/1996 | DiStefano et al. | |
| 5,508,228 A | 4/1996 | Nolan et al. | |
| 5,525,545 A | 6/1996 | Grube et al. | |
| 5,563,445 A | 10/1996 | Iijima et al. | |
| 5,600,103 A | 2/1997 | Odaira et al. | |
| 5,604,380 A | 2/1997 | Nishimura et al. | |
| 5,656,862 A | 8/1997 | Papathomas et al. | |
| 5,659,952 A | 8/1997 | Kovac et al. | |
| 5,666,270 A | 9/1997 | Matsuda et al. | |
| 5,679,977 A | 10/1997 | Khandros et al. | |
| 5,682,061 A | 10/1997 | Khandros et al. | |
| 5,707,902 A | 1/1998 | Chang et al. | |
| 5,734,547 A | 3/1998 | Iversen | |
| 5,749,997 A | 5/1998 | Tang et al. | |
| 5,766,987 A | 6/1998 | Mitchell et al. | |
| 5,772,451 A | 6/1998 | Dozier, II et al. | |
| 5,777,379 A | 7/1998 | Karavakis et al. | |
| 5,789,271 A | 8/1998 | Akram | |
| 5,790,377 A | 8/1998 | Schreiber et al. | |
| 5,874,781 A | 2/1999 | Fogal et al. | |
| 5,874,782 A | 2/1999 | Palagonia | |
| 5,885,849 A | 3/1999 | DiStefano et al. | |
| 5,929,517 A | 7/1999 | Distefano et al. | |
| 5,937,758 A | 8/1999 | Maracas et al. | |
| 5,956,235 A | 9/1999 | Kresge et al. | |
| 5,989,936 A * | 11/1999 | Smith et al. | 438/106 |
| 6,030,856 A | 2/2000 | DiStefano et al. | |
| 6,043,563 A | 3/2000 | Eldridge et al. | |
| 6,084,301 A | 7/2000 | Chang et al. | |
| 6,086,386 A | 7/2000 | Fjelstad et al. | |
| 6,130,116 A | 10/2000 | Smith et al. | |
| 6,133,639 A | 10/2000 | Kovac et al. | |
| 6,147,401 A | 11/2000 | Solberg | |
| 6,177,636 B1 | 1/2001 | Fjelstad | |
| 6,184,576 B1 | 2/2001 | Jones et al. | |
| 6,194,291 B1 * | 2/2001 | DiStefano et al. | 438/455 |
| 6,197,613 B1 | 3/2001 | Kung et al. | |
| 6,211,572 B1 | 4/2001 | Fjelstad et al. | |
| 6,230,400 B1 | 5/2001 | Tzanavaras et al. | |
| 6,249,051 B1 | 6/2001 | Chang et al. | |
| 6,255,738 B1 | 7/2001 | Distefano et al. | |
| 6,277,669 B1 | 8/2001 | Kung et al. | |
| 6,284,563 B1 | 9/2001 | Fjelstad | |
| 6,313,402 B1 | 11/2001 | Schreiber et al. | |
| 6,326,678 B1 | 12/2001 | Karnezos et al. | |
| 6,337,445 B1 | 1/2002 | Abbott et al. | |
| 6,359,335 B1 | 3/2002 | Distefano et al. | |
| 6,373,141 B1 | 4/2002 | DiStefano et al. | |
| 6,433,427 B1 | 8/2002 | Wu et al. | |
| 6,458,411 B1 | 10/2002 | Goossen et al. | |
| 6,465,878 B2 | 10/2002 | Fjelstad et al. | |
| 6,507,095 B1 | 1/2003 | Hashimoto et al. | |
| 6,525,429 B1 | 2/2003 | Kovac et al. | |
| 6,537,854 B1 | 3/2003 | Chang et al. | |
| 6,555,908 B1 | 4/2003 | Eichelberger et al. | |
| 6,624,653 B1 | 9/2003 | Cram | |
| 6,638,870 B2 | 10/2003 | Brintzinger et al. | |
| 6,642,136 B1 | 11/2003 | Lee et al. | |
| 6,660,626 B1 | 12/2003 | Lin | |
| 6,710,456 B1 | 3/2004 | Jiang et al. | |
| 6,746,898 B2 | 6/2004 | Lin et al. | |
| 6,767,818 B1 | 7/2004 | Chang et al. | |
| 6,767,819 B2 | 7/2004 | Lutz | |
| 6,803,663 B2 | 10/2004 | Hashimoto et al. | |
| 6,847,101 B2 | 1/2005 | Fjelstad et al. | |
| 6,870,272 B2 | 3/2005 | Kovac et al. | |
| 6,914,333 B2 | 7/2005 | Lo et al. | |
| 6,930,388 B2 | 8/2005 | Yamaguchi et al. | |
| 6,936,928 B2 | 8/2005 | Hedler et al. | |
| 6,940,177 B2 | 9/2005 | Dent et al. | |
| 6,972,490 B2 | 12/2005 | Chang et al. | |
| 6,979,591 B2 | 12/2005 | Hedler et al. | |
| 6,989,605 B2 | 1/2006 | Hashimoto et al. | |
| 2002/0063332 A1 * | 5/2002 | Yamaguchi et al. | 257/738 |
| 2002/0079575 A1 | 6/2002 | Hozoji et al. | |
| 2002/0084528 A1 | 7/2002 | Kim et al. | |
| 2002/0089058 A1 | 7/2002 | Hedler et al. | |
| 2002/0096787 A1 * | 7/2002 | Fjelstad | 257/779 |
| 2002/0121702 A1 | 9/2002 | Higgins | |
| 2002/0137256 A1 | 9/2002 | Knickerbocker et al. | |
| 2002/0151164 A1 | 10/2002 | Jiang et al. | |
| 2003/0049884 A1 | 3/2003 | Lutz | |
| 2003/0057567 A1 | 3/2003 | Hedler et al. | |
| 2004/0043538 A1 | 3/2004 | Lo et al. | |
| 2004/0164400 A1 | 8/2004 | Meyer-Berg | |
| 2004/0222518 A1 | 11/2004 | Haba et al. | |
| 2004/0227225 A1 | 11/2004 | Fjelstad et al. | |
| 2005/0097127 A1 | 5/2005 | Iijima et al. | |
| 2005/0127527 A1 | 6/2005 | Haimerl et al. | |
| 2005/0146030 A1 | 7/2005 | Miyazaki | |
| 2005/0260794 A1 | 11/2005 | Lo et al. | |
| 2006/0138647 A1 | 6/2006 | Crisp et al. | |

FOREIGN PATENT DOCUMENTS

| | | |
|---|---|---|
| JP | 1155633 | 6/1989 |
| JP | 1164054 | 6/1989 |
| JP | 1235261 | 9/1989 |
| JP | 1253926 | 10/1989 |
| JP | 1278755 | 11/1989 |
| JP | 2056941 | 2/1990 |
| JP | 4-091443 | 3/1992 |
| JP | 4137641 | 5/1992 |
| JP | 04280458 | 10/1992 |
| JP | 05251455 | 9/1993 |
| WO | 9403036 | 2/1994 |
| WO | 98/52225 | 11/1998 |
| WO | 99/05895 | 2/1999 |
| WO | 2006091793 A1 | 8/2006 |

OTHER PUBLICATIONS

"Methods of Testing Chips and Joining Chips to Substrates," 2244 Research Disclosure, Feb. 1991, Elmsworth, GB. 32290.

International Search Report, PCT/US2007/026103.

Office Action from Chineses Application No. 200780049974.7 mailed Jun. 24, 2010.

* cited by examiner

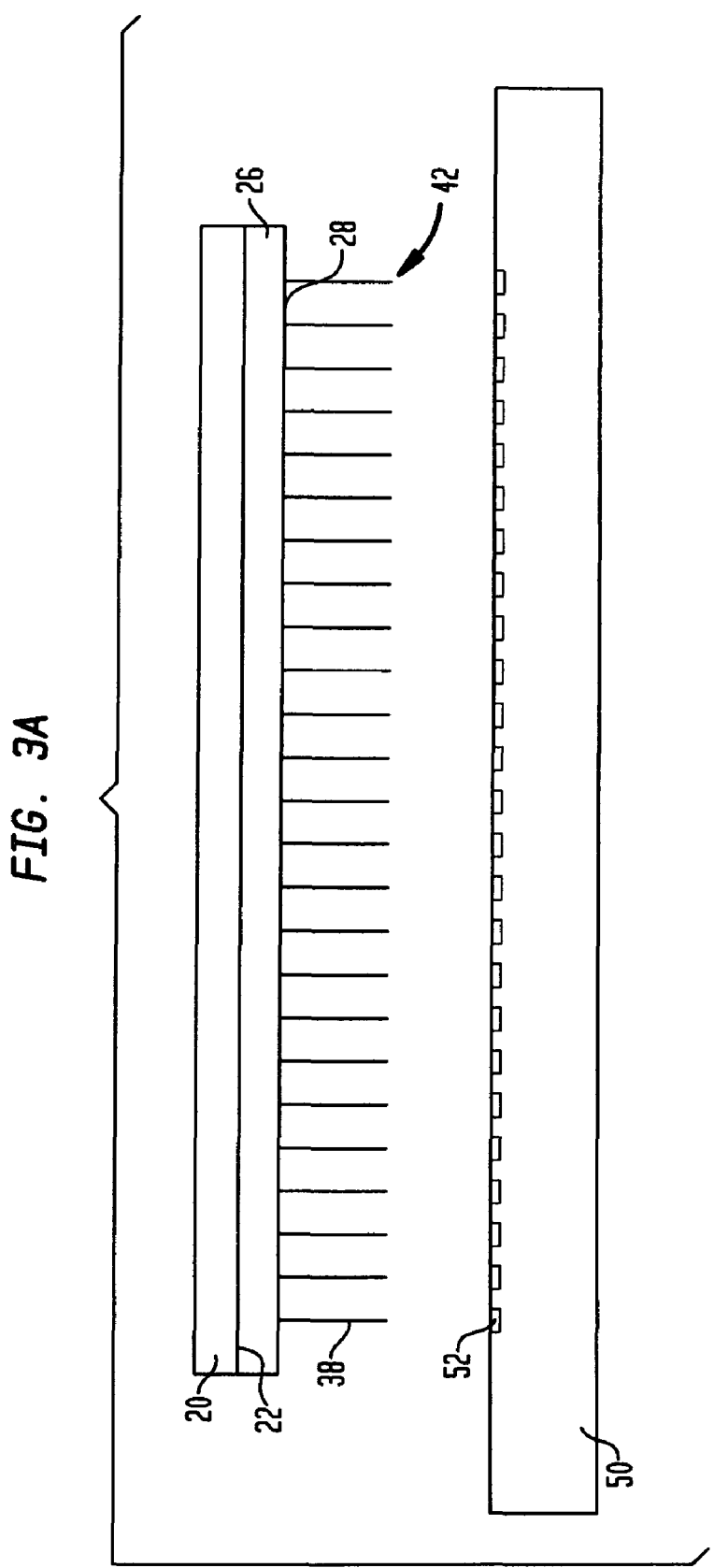

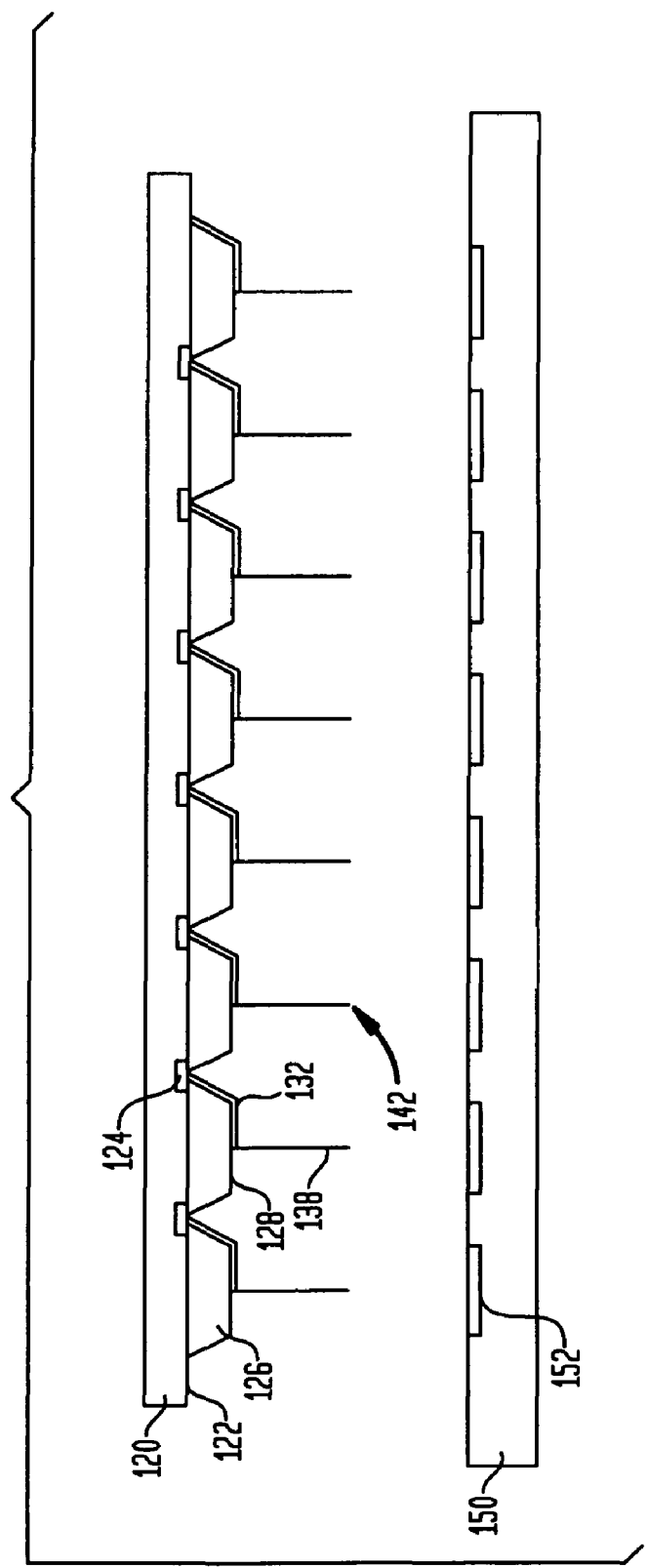

MICROELECTRONIC ASSEMBLIES HAVING COMPLIANCY

CROSS REFERENCE TO RELATED APPLICATIONS

The present application claims the benefit of the filing date of U.S. Provisional Application Ser. No. 60/656,480, filed Feb. 25, 2005, the disclosure of which is hereby incorporated by reference herein.

BACKGROUND OF THE INVENTION

The present invention relates to wafer-level and semiconductor chip packaging. More particularly, the present invention relates to improved compliant wafers and compliant semiconductor package structures and methods for making and testing the same.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, when testing wafers and packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Despite all of the above-described advances in the art, still further improvements in making and testing wafers and microelectronic packages would be desirable.

SUMMARY OF THE INVENTION

In certain preferred embodiments of the present invention, a microelectronic assembly includes a microelectronic element, such as a semiconductor wafer or chip, having a first surface and contacts accessible at the first surface. The assembly desirably includes a compliant layer overlying the first surface of the microelectronic element, the compliant layer preferably having openings in substantial alignment with the contacts of the microelectronic element. A dielectric passivation layer may be disposed between the first surface of the microelectronic element and the compliant layer. The assembly also desirably includes conductive posts overlying the compliant layer and projecting away from the first surface of the microelectronic element, whereby the conductive posts are electrically interconnected with the contacts of the microelectronic element. When the tip ends of the conductive posts are abutted against conductive pads, such as the conductive pads on a test board or printed circuit board, the tips of the conductive posts are able to move relative to the contacts on the microelectronic element so as to accommodate for non-planarities.

In certain preferred embodiments, the compliant layer is preferably made of a material having a low modulus of elasticity. The compliant layer may be made of materials such as silicones, flexibilized epoxies, polyimides, thermosetting polymers, fluoropolymers and thermoplastic polymers. In still other preferred embodiments, the compliant layer may have a top surface, such as a flat top surface, and a sloping surface extending between the top surface of the compliant layer and the first surface of the microelectronic element. The sloping surface may include at least one curved surface. In particular preferred embodiments, the sloping surface includes a first curved surface extending from the first surface of the microelectronic element and a second curved surface extending from the top surface of the compliant layer.

The microelectronic assembly desirably includes elongated, electrically conductive elements for electrically interconnecting the conductive posts and the contacts of the microelectronic element. The elongated, electrically conductive elements may include materials such as copper, gold, nickel and alloys, combinations and composites thereof. In certain preferred embodiments, the elongated, electrically conductive elements may be bond ribbons or conductive traces. The elongated, electrically conductive elements preferably extend over the compliant layer.

In certain preferred embodiments of the present invention, the compliant layer includes a plurality of compliant bumps overlying the first surface of the microelectronic element. At least one of the conductive posts may be disposed atop at least one of the compliant bumps. In other preferred embodiments, each conductive post is disposed atop one of the compliant bumps. In still other preferred embodiments, two or more conductive posts may be disposed atop a single compliant bump. Each conductive post desirably has a base adjacent the compliant layer and a tip remote from the compliant layer. The conductive posts preferably have a height that is higher than the thickness of the solder mask so that the posts are the highest/tallest structure on the microelectronic assembly. As a result, during testing of the microelectronic assembly, the tips of the conductive posts are the first elements to engage the conductive pads on a test board. In certain preferred embodiments, the conductive posts desirably have a height of about 50-300 micrometers. In certain preferred embodiments, at least one of the conductive posts has a frustoconical shape with a base having a diameter of about 100-600 micrometers and a tip having a diameter of about 40-200 micrometers. The conductive posts may be made of an electrically conductive material, such as copper, copper alloys, gold and combinations thereof.

In other preferred embodiments of the present invention, a microelectronic assembly includes a microelectronic element, such as a semiconductor wafer or chip, having a first surface with contacts accessible at the first surface, and a compliant layer overlying the first surface of the microelectronic element, the compliant layer having a top surface spaced from the first surface of the microelectronic element. The assembly also desirably includes conductive posts overlying the top surface of the compliant layer and projecting away from the first surface of the microelectronic element, and elongated, conductive elements electrically interconnecting the conductive posts and the contacts of the microelectronic element.

The compliant layer may comprise a plurality of compliant bumps, with each conductive post being disposed atop one of the conductive bumps. The compliant layer desirably has openings in alignment with the contacts of the microelectronic element, the openings defining sloping surfaces of the compliant layer extending from the first surface of the microelectronic element to the top surface of the compliant layer. The elongated, conductive elements desirably overlie the sloping surfaces of the compliant layer.

In still other preferred embodiments of the present invention, a microelectronic assembly includes a microelectronic element having a first surface and contacts accessible at the first surface, and a plurality of compliant bumps overlying the first surface of the microelectronic element, each of the compliant bumps being disposed adjacent one of the contacts of the microelectronic element. The assembly desirably includes conductive posts overlying the microelectronic element and projecting away from the first surface of the microelectronic element, and conductive traces electrically interconnecting the conductive posts and the contacts of the microelectronic element, whereby the compliant bumps enable the conductive posts to move relative to the contacts of the microelectronic element.

The compliant bumps preferably have top surfaces that are spaced from the first surface of the microelectronic element and sloping surfaces that extend between the top surfaces of the compliant bumps and the first surface of the microelectronic element. The conductive traces desirably extend over the sloping surfaces of the compliant bumps.

These and other preferred embodiments of the present invention will be described in more detail below.

BRIEF DESCRIPTION OF THE DRAWINGS

FIGS. 3A and 3B show a method of testing the microelectronic assembly of FIG. 1D.

FIGS. 4A and 4B show a method of testing the microelectronic assembly of FIG. 2.

DETAILED DESCRIPTION OF PREFERRED EMBODIMENTS

FIGS. 1A-1D illustrate a cross-sectional side view of a process for creating compliant microelectronic assemblies having conductive posts or pins electrically interconnected therewith.

Figure 1A:
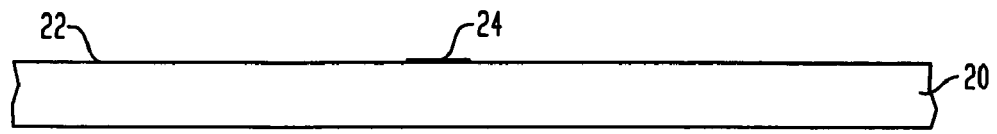
FIG. 1A is a cross-sectional view of a microelectronic element having one or more contacts.

FIG. 1A shows a semiconductor wafer 20 having a plurality of die or chips. The wafer has a first face or contact bearing face 22 with one or more contacts 24 accessible at the first face 22. The wafer may be singulated into individual chip packages at any point during the fabrication process disclosed herein. In other preferred embodiments, the wafer 20 may be replaced by a single microelectronic chip. A dielectric passivation layer (not shown) may be deposited or adhered onto the contact bearing face 22 of the wafer 20. The passivation layer may be a $SiO_2$ passivation layer commonly found on the contact-bearing surface of semiconductor chips. In another preferred embodiment, a separate dielectric passivation layer may be used such as an epoxy resin, polyimide resin, photoimagable dielectric, etc. When the separate passivation layer is used, the passivation layer may be spun onto and built up to a planar, sheet-like form on the face surface, or the dielectric sheet may be laminated to the face surface using any one of the electronic grade adhesives commonly known and used by those skilled in the art. The passivation layer preferably covers the contact bearing face 22 of the wafer and leaves the contacts 24 exposed so that a conductive element such as an elongated bond ribbon may be plated thereon in a later step, as described below.

Figure 1B:
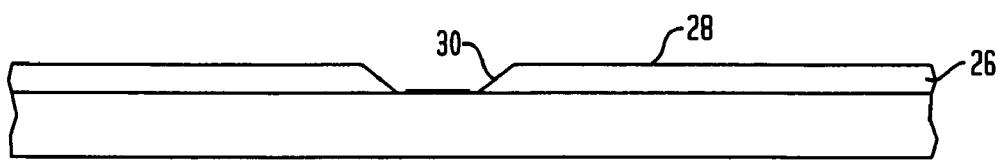
FIG. 1B is a cross-sectional view of the microelectronic element of FIG. 1A after a compliant layer has been formed over the contact-bearing surface of the microelectronic element.

Referring to FIG. 1B, a compliant layer 26 is deposited or laminated onto the exposed surface of the passivation layer (not shown). The compliant layer may be formed and/or have a shape as disclosed in commonly assigned U.S. Pat. Nos. 6,211,572; 6,284,563; 6,465,878; 6,847,101 and 6,847,107, and co-pending U.S. application Ser. Nos. 09/020,647 and 10/873,883, the disclosures of which are hereby incorporated by reference herein. [TESSERA 078 line of cases] The compliant layer 26 may be stenciled, screened or transfer molded on a passivation layer using a curable liquid which, when cured, adheres to the passivation layer. Alternatively, the compliant layer 26 may be adhered to the exposed surface of the passivation layer in the form of cured compliant pads using an electronic grade adhesive. The compliant layer 26 preferably has a substantially flat top surface 28 and a gradual, sloping transition surface 30 between the contact bearing face 22 of the wafer 20 and the top surface 28 of the compliant layer. The sloping transition surface 30 may follow a line of curvatures between the contact bearing face 26 and the substantially flat top surface 28 or may simply be canted at an angle such that the sloping surface 30 is not too vertically oriented in relation to the contact bearing surface 22 and the substantially flat surface 28. The compliant layer 26 may be formed from a wide variety of materials, such as a low modulus of elasticity material. The compliant layer may also be fabricated of polymeric and other materials such as silicones, flexibilized epoxies, polyimides and other thermosetting polymers, fluoropolymers and thermoplastic polymers.

A plating seed layer (not shown) may be deposited atop the aforementioned assembly. The seed layer may be deposited using a sputtering operation. Typical plating seed layer materials include palladium (for electroless plating), titanium, tungsten nickel and chromium. In other preferred embodiments, however, primarily copper seed layers are used.

Figure 1C:
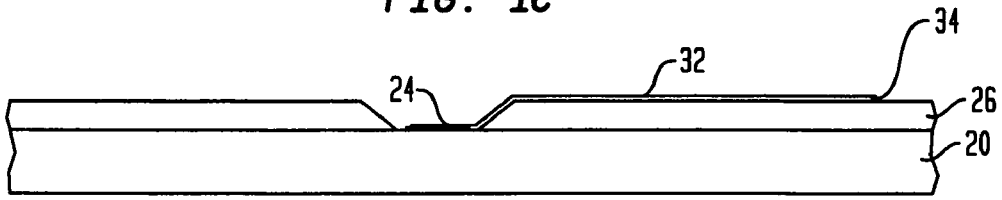
FIG. 1C is a cross-sectional view of the micro electronic subassembly shown in the FIG. 1B after elongated conducted traces have been formed atop the compliant layer.

Referring to FIG. 1C, a photoresist (not shown) may be applied to the exposed top surface of the compliant layer 26 and then exposed and developed for forming elongated, electrically conductive bond ribbons or traces 32 that form electrically conductive pads. The electrically conductive bond ribbons preferably electrically interconnect the chip contacts 24 near a first and of the conductive ribbons 32 and terminals 34 near a second end of the electrically conductive bond ribbons 32. The bond ribbons may be plated directly onto the contacts 24. Preferred bond ribbons materials include copper, gold, nickel and alloys, combinations and composites thereof.

Figure 1D:
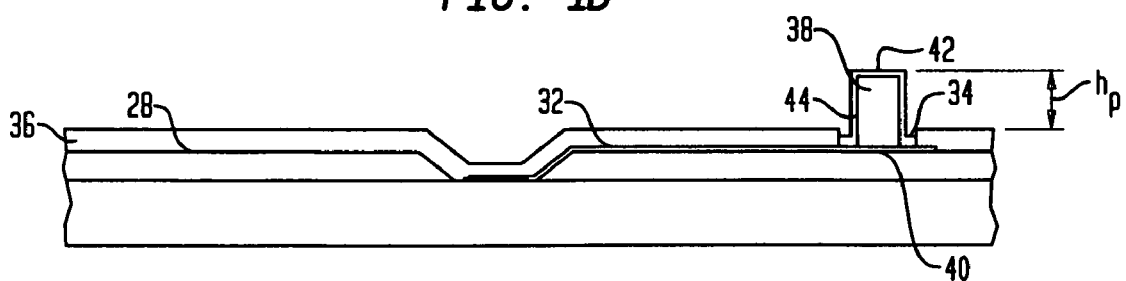
FIG. 1D is a cross-sectional view of the microelectronic subassembly of FIG. 1C after conductive posts or pins have been formed atop the elongated conductive traces shown in FIG. 1C.

Referring to FIG. 1D, a masking layer 36 may be deposited or laminated over the top of the assembly so that only the terminals 34 are exposed. The masking layer may be a dielectric material. The solder mask may comprise a screened, exposed and developed or laminated sheet, a photo-resisting material or may comprise a paralyne epoxy resin, polyimide resin, fluoropolymer, etc., which is deposited or laminated onto the assembly. As seen in FIG. 1D, the masking layer 36 can be a conformal layer having an exposed top surface which conforms to a shape of the underlying compliant layer 26 and the electrically conductive bond ribbons or traces 32 thereon. Stated another way, the height of the top surface of the solder mask above the contact bearing face 22 of the wafer can vary with the shape of the underlying sloping transition surface 30 and the underlying top surface 28 of the compliant layer 26.

Referring to FIG. 1D, conductive posts or pins 38 are formed atop each of the conductive terminals 34. The conductive posts or pins may be plated or deposited so that they project above the contact bearing face 22 of the semiconductor wafer 20 or chip. In certain preferred embodiments, each conductive post 38 is preferably connected to the terminal end 34 of the conductive trace 32. The dimensions of the posts may vary over a significant range. In certain preferred embodiments, the posts have a height $h_p$ above the top surface 28 of the compliant layer 26 of about 50-300 micrometers. Each post has a base 40 adjacent the compliant layer and a tip 42 remote from the compliant layer. The conductive posts 38 may be formed from any electrically conductive materials, but desirably are formed from metallic materials such as copper, copper alloys, gold and combinations thereof. For example, the conductive posts 38 may be formed from copper with a layer of gold 44 provided at the surfaces of the posts 38.

In certain preferred embodiments, conventional processes such as plating may form the conductive traces and the conductive posts may be formed using the methods disclosed in commonly assigned U.S. Pat. No. 6,177,636, the disclosure of which is hereby incorporated by reference herein. In yet other preferred embodiments, the conductive posts may be fabricated as individual elements and assembled to the microelectronic assembly in any suitable manner that connects the conductive posts to the terminal ends of the conductive traces 32. In still other preferred embodiments, the assembly may be formed by depositing a seed layer, plating conductive traces having first ends connected with the contacts of the microelectronic element and second ends disposed atop the compliant layer, plating the conductive posts atop the compliant layer and in contact with the conductive traces and removing the seed layer. The assembly may also be formed by electrolessly plating the conductive posts. The conductive posts may be formed by electrolessly plating the posts using copper or nickel.

Figure 2:
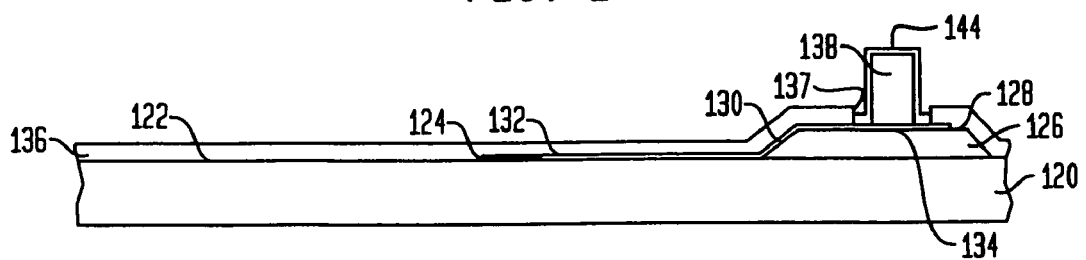
FIG. 2 shows a cross-sectional view of a microelectronic assembly, in accordance with another preferred embodiment of the present invention.

Referring to FIG. 2, in other preferred embodiments of the present invention, a microelectronic assembly includes a semiconductor chip 120 having a contact bearing face 122 with chip contacts 124. One or more bumps of a compliant material 126 are formed atop the contact bearing face 122 of the semiconductor chip 120. In certain preferred embodiments, one or more of the compliant bumps 126 may include a substantially flat top surface 128 and a slopping surface 130 that transitions between the top surface 128 and the contact bearing surface 122 of the semiconductor chip 120. One or more conductive bond ribbons 132 are formed atop the assembly. Each conductive bond ribbon 132 has a first end electrically interconnected with the contact 124 and a second terminal end 134 that overlies the substantially flat top surface 128 of the compliant bump 126. A masking layer 136 may be provided over the top of the microelectronic subassembly. The masking layer 136 includes openings 137. The terminal ends 134 the conductive traces 132 are exposed through the openings 137. One or more conductive posts 138 are formed atop the subassembly. Each conductive post 138 is preferably electrically interconnected with the terminal end 134 of the conductive trace 132. The conductive posts may be covered with a layer gold 144.

Figure 3B:
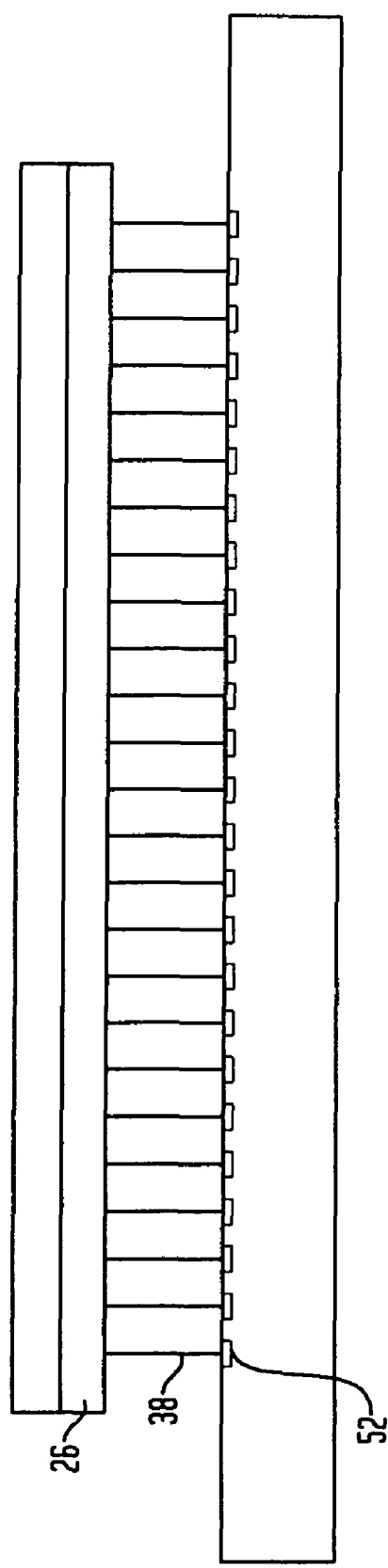

Referring to FIG. 3A, the microelectronic assembly of FIG. 1D may be tested using a substrate 50, such as a printed circuit board, having conductive pads 52. The illustration of the microelectronic assembly shown in FIGS. 3A and 3B has been simplified for clarity. The microelectronic assembly includes wafer 20 having a first face 22 and compliant layer 26 overlying the first face 22 of the wafer 20. Conductive posts 38 project from the top surface 28 of the compliant layer 26. The conductive posts 38 are electrically interconnected with contacts on the wafer 20.

Referring to FIGS. 3A and 3B, in order to test the microelectronic assembly, the tips 42 of the conductive posts 38 are juxtaposed with the conductive pads 52 of the circuitized substrate 50. As shown in FIG. 3B, the tips of the conductive posts are pressed against the conductive pads. The compliant layer 26 enables the tips pf the conductive posts to move relative to the contacts on the wafer to accommodate for non-planarities between the posts and the conductive pads, as well as for thermal mismatch. If the test of the microelectronic assembly is successful, the assembly may be permanently attached to a substrate such as a printed circuit board, such as by using solder or another fusible or conductive material.

Figure 4B:
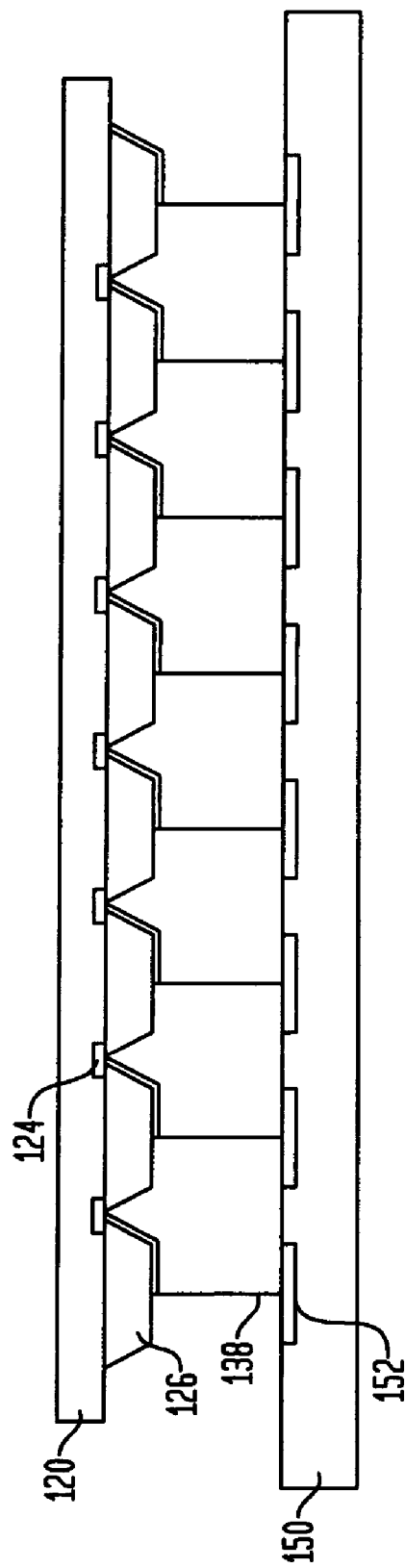

Referring to FIG. 4A, the microelectronic assembly of FIG. 2 may be tested using a substrate 150, such as a test board, having conductive pads 152. The representation of the microelectronic assembly shown in FIGS. 4A and 4B has been simplified for clarity of illustration. The microelectronic assembly includes wafer 120 having a first face 122 and compliant bumps 126 overlying the first face 122 of the wafer 120. Conductive posts 138 project from the top surfaces 128 of the compliant bumps 126. The conductive posts 138 are electrically interconnected with contacts 124 on the wafer 120 by conductive traces 132. The conductive traces preferably overlie the compliant bumps. The conductive traces are preferably in contact with the compliant bumps. In certain preferred embodiments, the conductive traces are in contact with the compliant bumps and overlie the sloping edges of the compliant bumps. The tips of the conductive posts are preferably the highest part of the microelectronic assembly so that the tips are the first part of the assembly to engage the conductive pads on the test board. The conductive posts may have any height so long as the height is higher than the solder mask formed atop the compliant layer or compliant bumps and/or so long as the tips of the posts define the highest point of the assembly. As a result, the tips of the conductive posts may directly engage the conductive pads on a test board during a testing operation, without requiring additional materials such as solder or conductive links/bridges.

Referring to FIGS. 4A and 4B, in order to test the microelectronic assembly, the tips 142 of the conductive posts 138 are juxtaposed with the conductive pads 152 of the circuitized substrate 150. As shown in FIG. 4B, the tips of the conductive posts 138 are pressed against the conductive pads 152 for forming an electrical interconnection between the microelectronic assembly and the substrate 150. The compliant bumps 126 enable the conductive posts 138 to move relative to the contacts 124 on the wafer 120 to accommodate for nonplanarities between the posts 138 and the conductive pads 152 on the test substrate, as well as for thermal mismatch. If the test of the microelectronic assembly is successful, the assembly may be permanently attached to a substrate such as a printed circuit board by using solder or another fusible or conductive material.

Figure 5:
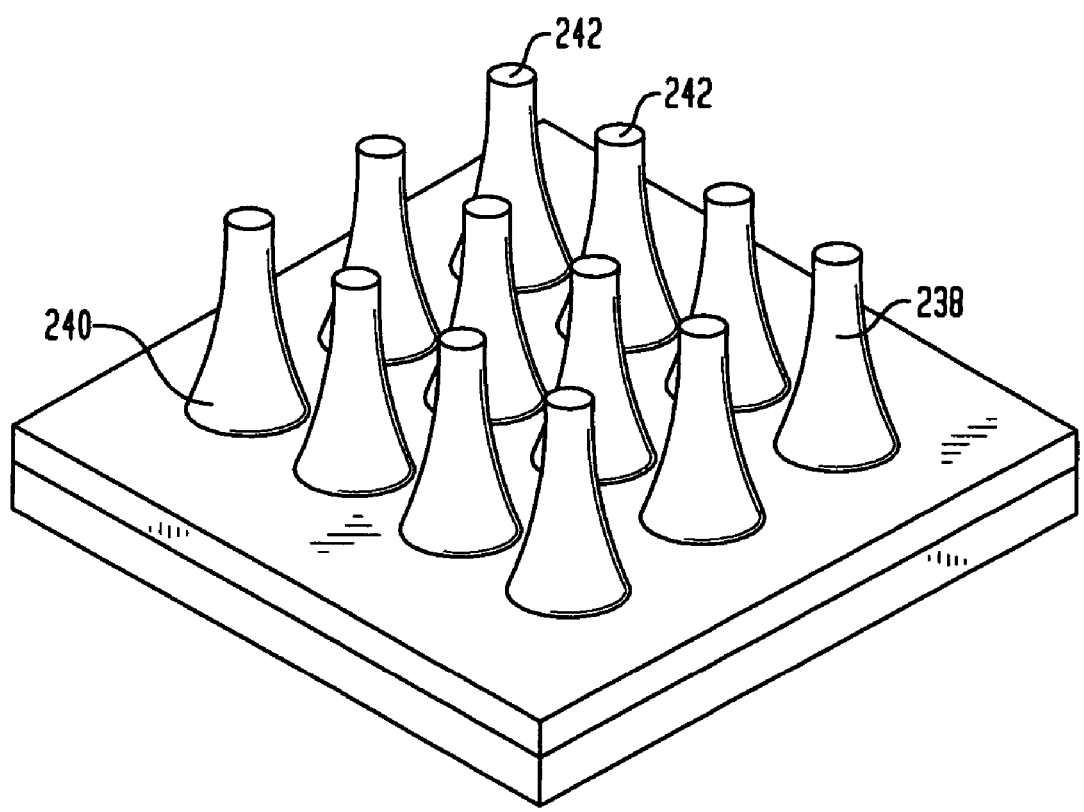
FIG. 5 shows a microelectronic assembly, in accordance with another preferred embodiment of the present invention.

Referring to FIG. 5, in certain preferred embodiments of the present invention, the conductive posts 238 may be generally frustoconical in shape, whereby the base 240 and the tip 242 of each post 238 are substantially circular. In these particular preferred embodiments, the bases 240 of the posts typically are about 100-600 micrometers in diameter, whereas the tips 242 typically are about 40-200 micrometers in diameter. The exterior surfaces of the conductive posts may be optionally plated with a highly conductive layer, such as gold, gold/nickel, gold/osmium or gold/palladium, or alternately plated with a wear resistant, conductive coating such as osmium to ensure that a good connection is made when the posts are either soldered or socketed to a substrate.

In certain preferred embodiments of the present invention, the posts may have a shape that facilitates a tilting motion that causes the tip of each post to wipe across an opposing contact pad as the tip is engaged with the contact pad. This tilting motion promotes reliable electrical contact. As discussed in greater detail in the co-pending, commonly assigned U.S. patent application Ser. No. 10/985,126, filed Nov. 10, 2004, entitled "MICRO PIN GRID ARRAY WITH WIPING ACTION," the disclosure of which is incorporated by reference herein, the posts may be provided with features which promote such wiping action and otherwise facilitate engagement of the posts and contacts. Conductive posts having other shapes and designs that promote wiping and/or good electrical contact are disclosed in greater detail in co-pending, commonly assigned U.S. patent application Ser. No. 10/985,119, filed Nov. 10, 2004, entitled "MICRO PIN GRID WITH PIN MOTION ISOLATION," and commonly assigned U.S. patent application Ser. No. 11/014,439, filed Dec. 16, 2004, entitled "MICROELECTRONIC PACKAGES AND METHODS THEREFOR," the disclosures of which is hereby incorporated by reference herein.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

The posts may also be fabricated by a process such as that disclosed in co-pending, commonly assigned U.S. patent application Ser. No. 10/959,465, filed Oct. 6, 2004 and entitled "Formation of Circuitry With Modification of Feature Height," the disclosure of which is hereby incorporated by reference herein.

Although the present invention is not limited by any particular theory of operation, it is believed that providing conductive posts atop a compliant material as disclosed herein will provide a compliant wafer-level or chip package that accommodates thermal mismatch and insures the formation of proper electrical interconnections. In addition, the use of conductive pins or posts enables the microelectronic assemblies and/or wafers to be tested by abutting the tips of the conductive posts directly against the contacts on a test board, without requiring the use of a test socket.

Although the present disclosure provides a particular sequence for making the microelectronic assemblies and wafers described herein, the order of the sequence may be altered and still fall within the scope of the present invention.

In certain preferred embodiments, the structures disclosed herein may be used to make a test board having a compliant layer and conductive posts projecting from the compliant layer. The contacts on a bare wafer or die may be abutted against the tips of the conductive posts for testing the wafer or die.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
    a microelectronic element having a first surface and contacts accessible at the first surface;
    a compliant layer overlying a portion of the first surface of said microelectronic element, the compliant layer having a top surface remote from the first surface and a sloping transition surface extending away from the top surface, wherein at least a portion of at least one of the contacts is exposed beyond the sloping transition surface of the compliant layer;
    conductive traces extending along the sloping transition surface and the top surface of said compliant layer, said traces connected with the contacts;
    a plurality of substantially rigid metal posts overlying said compliant layer and projecting away from the first surface of said microelectronic element, said substantially rigid metal posts disposed remote from said contacts, each said substantially rigid metal post having a monolithic metal layer extending directly from a trace of said traces and extending above a height of said traces and to a majority of a height of such post, wherein said monolithic metal layer consists essentially of at least one metal selected from the group consisting of: copper, copper alloys, gold and combinations thereof, and nickel, each said substantially rigid metal post having a base adjacent said compliant layer and a tip remote from said compliant layer, said base having a width along a surface of the compliant layer not greater than a width of any other portion of said substantially rigid metal post;

a solder mask overlying portions of the conductive traces, the solder mask having an exposed top surface and openings, wherein the substantially rigid metal posts extend through the openings to a height above the top surface of the solder mask; and wherein said solder mask is a conformal layer such that a height of the to surface of the solder mask above the first surface of the microelectronic element varies with a shape of the compliant layer.

2. The assembly as claimed in claim 1, wherein said tips of said substantially rigid metal posts define the highest point on said assembly.

3. The assembly as claimed in claim 1, wherein said compliant layer has openings in substantial alignment with said contacts of said microelectronic element.

4. The assembly as claimed in claim 3, wherein said conductive traces pass through the openings in said compliant layer for conductively interconnecting said substantially rigid metal posts and said contacts of said microelectronic element.

5. The assembly as claimed in claim 1, wherein said microelectronic element is a semiconductor wafer.

6. The assembly as claimed in claim 1, wherein said microelectronic element is a semiconductor chip.

7. The assembly as claimed in claim 1, further comprising a dielectric passivation layer disposed between the first surface of said microelectronic element and said compliant layer.

8. The assembly as claimed in claim 1, wherein said compliant layer comprises a material having a low modulus of elasticity.

9. The assembly as claimed in claim 1, wherein said compliant layer comprises a dielectric material.

10. The assembly as claimed in claim 1, wherein said compliant layer comprises a material selected from the group consisting of silicones, flexibilized epoxies, polyimides, thermosetting polymers, fluoropolymers and thermoplastic polymers.

11. The assembly as claimed in claim 1, wherein said sloping transition surface extends between the top surface of said compliant layer and the first surface of said microelectronic element.

12. The assembly as claimed in claim 11, wherein the top surface of said compliant layer is substantially flat.

13. The assembly as claimed in claim 12, wherein the sloping transition surface includes at least one curved surface.

14. The assembly as claimed in claim 13, wherein the at least one curved surface includes a curved surface extending from the first surface of said microelectronic element.

15. The assembly as claimed in claim 13, wherein the at least one curved surface includes a curved surface extending from the top surface of said compliant layer.

16. The assembly as claimed in claim 1, wherein said conductive traces electrically interconnect said substantially rigid metal posts and said contacts of said microelectronic element.

17. The assembly as claimed in claim 1, wherein said traces comprise at least one material selected from the group consisting of copper, gold, nickel and alloys, combinations and composites thereof.

18. The assembly as claimed in claim 1, wherein said conductive traces extend over said compliant layer.

19. The assembly as claimed in claim 1, wherein said compliant layer comprises a plurality of compliant bumps overlying the first surface of said microelectronic element.

20. The assembly as claimed in claim 19, wherein at least one of said conductive posts is disposed atop at least one of said compliant bumps.

21. The assembly as claimed in claim 19, wherein said conductive posts are disposed atop said compliant bumps.

22. The assembly as claimed in claim 1, wherein each said substantially rigid metal post has a thickness of about 50-300 micrometers.

23. The assembly as claimed in claim 1, wherein at least one of said conductive posts has a frustoconical shape with the base having a diameter of about 100-600 micrometers and the tip having a diameter of about 40-200 micrometers.

24. The assembly as claimed in claim 1, wherein said monolithic metal layer consists essentially of at least one metal selected from the group consisting of: copper and copper alloys.

25. The assembly as claimed in claim 1, wherein said monolithic metal layer consists essentially of a plated metal layer and is plated in contact with said trace.

26. The assembly as claimed in claim 1, wherein the tips of the substantially rigid metal posts have widths equal to the widths of the respective bases of the posts.

27. The assembly as claimed in claim 1, wherein the tip of at least one of the substantially rigid metal posts has a width equal to the width of the base of the at least one post.

28. The assembly as claimed in claim 1, wherein said monolithic metal layer has straight edges extending in an at least substantially vertical direction from said trace.

29. The assembly as claimed in claim 1, wherein edges of said monolithic metal layer extend in the vertical direction.

30. A microelectronic assembly comprising:
a microelectronic element having a first surface and contacts accessible at the first surface;
a compliant layer overlying a portion of the first surface of said microelectronic element, said compliant layer having a top surface spaced from the first surface of said microelectronic element and a sloping transition surface extending away from the top surface, wherein the first surface of the microelectronic element is exposed between at least one of the contacts and the sloping transition surface;
conductive posts overlying the top surface of said compliant layer and projecting away from the first surface of said microelectronic element, said conductive posts disposed remote from said contacts;
elongated, conductive elements electrically interconnecting said conductive posts and said contacts of said microelectronic element;
a solder mask overlying portions of the conductive elements, the solder mask having an exposed top surface and openings, wherein the conductive posts extend through the openings to a height above the top surface of the solder mask,
wherein each said conductive post has a monolithic metal layer extending directly from a conductive element of said conductive elements and extending above a height of said conductive elements and to a majority of a height of such post, wherein said monolithic metal layer consists essentially of at least one metal selected from the group consisting of: copper, copper alloys, gold and combinations thereof, and nickel, and said monolithic metal layer consists essentially of a plated metal layer and is plated in contact with the conductive traces elements; and
wherein said solder mask is a conformal layer such that a height of the to surface of the solder mask above the first surface of the microelectronic element varies with a shape of the compliant layer.

31. The assembly as claimed in claim 30, wherein said microelectronic element is a semiconductor wafer.

32. The assembly as claimed in claim 30, wherein said microelectronic element is a semiconductor chip.

33. The assembly as claimed in claim 30, wherein said compliant layer comprises a plurality of compliant bumps and each said conductive post is disposed atop one of said conductive bumps.

34. The assembly as claimed in claim 30, wherein said compliant layer has openings in alignment with said contacts of said microelectronic element, said sloping transition surface of said compliant layer disposed in at least one of said openings and extending from the first surface of said microelectronic element to the top surface of said compliant layer, wherein said elongated, conductive elements overlie the sloping transition surface of said compliant layer.

35. The assembly as claimed in claim 30, wherein said monolithic metal layer consists essentially of at least one metal selected from the group consisting of: copper and copper alloys.

36. The assembly as claimed in claim 30, wherein tips of the conductive posts remote from said compliant layer have widths equal to the widths of bases of the posts adjacent said compliant layer.

37. The assembly as claimed in claim 30, wherein a tip of at least one of the conductive posts remote from said compliant layer has a width equal to the width of a base of the at least one post adjacent said compliant layer.

38. The assembly as claimed in claim 30, wherein said monolithic metal layer has straight edges extending in an at least substantially vertical direction from the conductive element.

39. The assembly as claimed in claim 30, wherein edges of said monolithic metal layer extend in the vertical direction.

40. A microelectronic assembly comprising:
- a microelectronic element having a first surface and contacts accessible at the first surface;
- a compliant layer overlying a portion of the first surface of said microelectronic element, wherein the compliant layer does not wholly overlie at least one of the contacts;
- conductive traces exposed at a top surface of said compliant layer, said traces connected with the contacts;
- a dielectric layer overlying portions of the conductive traces, the dielectric layer having an exposed top surface and openings;
- a plurality of substantially rigid metal posts overlying said compliant layer and projecting away from the first surface of said microelectronic element, said substantially rigid metal posts being directly in contact with said traces, each said substantially rigid metal post having a monolithic metal layer extending directly from a trace of said traces and extending above a height of said traces and to a majority of a height of such post, wherein said monolithic metal layer consists essentially of at least one metal selected from the group consisting of: copper, copper alloys, gold and combinations thereof, and nickel,
- wherein the substantially rigid metal posts extend through the openings to a height above the top surface of the dielectric layer; and
- wherein said dielectric layer is a conformal layer such that a height of the to surface of the dielectric layer above the first surface of the microelectronic element varies with a shape of the compliant layer.

41. The assembly as claimed in claim 40, wherein said monolithic metal layer consists essentially of at least one metal selected from the group consisting of: copper and copper alloys.

42. The assembly as claimed in claim 40, wherein said monolithic metal layer consists essentially of a plated metal layer and is plated in contact with said trace.

43. The assembly as claimed in claim 40, wherein tips of the substantially rigid metal posts remote from said compliant layer have widths equal to the widths of bases of the posts adjacent said compliant layer.

44. The assembly as claimed in claim 40, wherein a tip of at least one of the substantially rigid metal posts remote from said compliant layer has a width equal to the width of a base of the at least one post adjacent said compliant layer.

45. The assembly as claimed in claim 40, wherein said monolithic metal layer has straight edges extending in an at least substantially vertical direction from the trace.

46. The assembly as claimed in claim 40, wherein edges of said monolithic metal layer extend in the vertical direction.

* * * * *

UNITED STATES PATENT AND TRADEMARK OFFICE
CERTIFICATE OF CORRECTION

| | |
|---|---|
| PATENT NO. | : 7,999,379 B2 |
| APPLICATION NO. | : 11/360230 |
| DATED | : August 16, 2011 |
| INVENTOR(S) | : Belgacem Haba |

Page 1 of 1

It is certified that error appears in the above-identified patent and that said Letters Patent is hereby corrected as shown below:

Column 11, line 7, please change the word "to" to read --top--.
Column 12, line 63, please change the word "to" to read --top--.
Column 14, line 17, please change the word "to" to read --top--.

Signed and Sealed this
Twenty-fifth Day of September, 2012

David J. Kappos
*Director of the United States Patent and Trademark Office*